(12) United States Patent
Horstman et al.

(10) Patent No.: US 9,150,727 B2
(45) Date of Patent: Oct. 6, 2015

(54) COMPOSITIONS COMPRISING RESIN-LINEAR ORGANOSILOXANE BLOCK COPOLYMERS AND ORGANOPOLYSILOXANES

(71) Applicant: Dow Corning Corporation, Midland, MI (US)

(72) Inventors: John Bernard Horstman, Midland, MI (US); Steven Swier, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 0 days.

(21) Appl. No.: 14/386,189

(22) PCT Filed: Mar. 12, 2013

(86) PCT No.: PCT/US2013/030386
§ 371 (c)(1),
(2) Date: Sep. 18, 2014

(87) PCT Pub. No.: WO2013/154718
PCT Pub. Date: Oct. 17, 2013

(65) Prior Publication Data
US 2015/0073077 A1    Mar. 12, 2015

Related U.S. Application Data

(60) Provisional application No. 61/613,510, filed on Mar. 21, 2012.

(51) Int. Cl.
| | |
|---|---|
| C08G 77/44 | (2006.01) |
| C08L 83/10 | (2006.01) |
| C09D 183/10 | (2006.01) |
| H01L 23/29 | (2006.01) |
| C08G 77/00 | (2006.01) |
| H01L 33/56 | (2010.01) |

(52) U.S. Cl.
CPC .......... *C08L 83/10* (2013.01); *C08G 77/44* (2013.01); *C08G 77/70* (2013.01); *C08G 77/80* (2013.01); *C09D 183/10* (2013.01); *H01L 23/296* (2013.01); *C08L 2205/02* (2013.01); *H01L 33/56* (2013.01)

(58) Field of Classification Search
None
See application file for complete search history.

(56) References Cited

U.S. PATENT DOCUMENTS

| | | | |
|---|---|---|---|
| 3,294,737 A | | 12/1966 | Krantz |
| 3,328,481 A | * | 6/1967 | Vincent ................. 525/477 |
| 3,576,905 A | * | 4/1971 | Hartlein et al. ............ 528/34 |
| 3,619,229 A | * | 11/1971 | Hartlein ................. 523/209 |
| 3,629,228 A | * | 12/1971 | Hartlein et al. ............ 528/17 |
| 3,647,846 A | * | 3/1972 | Hartlein et al. ........... 556/436 |
| 3,670,649 A | * | 6/1972 | Hartlein et al. ........... 102/431 |
| 4,013,611 A | * | 3/1977 | Hechtl et al. ............ 523/212 |
| 4,419,402 A | * | 12/1983 | Gutek ................. 442/145 |
| 4,443,502 A | * | 4/1984 | Gutek ................. 427/387 |
| 7,312,008 B2 | * | 12/2007 | Wu et al. ................ 430/66 |
| 2005/0180712 A1 | * | 8/2005 | Shelnut et al. ........... 385/129 |
| 2006/0035092 A1 | * | 2/2006 | Shimizu et al. ........... 428/447 |
| 2007/0196309 A1 | * | 8/2007 | Tarletsky et al. ......... 424/70.12 |
| 2008/0042142 A1 | | 2/2008 | Sugawara et al. |
| 2009/0297461 A1 | * | 12/2009 | Perle et al. .............. 424/59 |
| 2010/0081748 A1 | * | 4/2010 | Taguchi et al. ........... 524/433 |
| 2010/0273927 A1 | * | 10/2010 | Taguchi et al. ........... 524/433 |

FOREIGN PATENT DOCUMENTS

| | | |
|---|---|---|
| CN | 102304323 A | 1/2012 |
| JP | 57131250 A | 8/1982 |
| WO | WO-2012/040305 A1 | 3/2012 |
| WO | WO-2012/040453 A1 | 3/2012 |
| WO | WO 2013/154718 A1 | 10/2013 |

OTHER PUBLICATIONS

"International Application Serial No. PCT/US2013/030386, International Search Report mailed Jul. 19, 2013", 4 pgs.
"International Application Serial No. PCT/US2013/030386, Written Opinion mailed Jul. 19, 2013", 6 pgs.

* cited by examiner

*Primary Examiner* — Robert S Loewe
(74) *Attorney, Agent, or Firm* — Schwegman Lundberg & Woessner, P.A.

(57) ABSTRACT

Resin-linear organosiloxane block copolymers combined with linear or resin organopolysiloxane components are disclosed. In some embodiments, the combination of resin-linear organosiloxane block copolymers with linear or resin organopolysiloxane components provides compositions having improved physical properties, such as improved toughness and flow behavior.

24 Claims, No Drawings

COMPOSITIONS COMPRISING RESIN-LINEAR ORGANOSILOXANE BLOCK COPOLYMERS AND ORGANOPOLYSILOXANES

CROSS-REFERENCE TO RELATED APPLICATIONS

This application is a U.S. national stage application filed under 35 U.S.C. 371 from International Application Serial No. PCT/US2013/030386, which was filed Mar. 12, 2013, and published as WO 2013/154718 on Oct. 17, 2013, and which claims the benefit of U.S. Provisional Appl. Ser. No. 61/613,510, filed Mar. 21, 2012, which applications and publication are incorporated by reference as if reproduced herein and made a part hereof in their entirety, and the benefit of priority of each of which is claimed herein.

BACKGROUND

Light emitting diodes (LEDs) and solar panels use an encapsulant coating to protect electronic components from environmental factors. Such protective coatings must be optically clear to ensure maximum efficiency of these devices. Furthermore, these protective coatings must be tough, durable, long lasting, and yet easy to apply. Many of the currently available coatings, however, lack toughness; are not durable; are not long-lasting; and/or are not easy to apply. There is therefore a continuing need to identify protective and/or functional coatings in many areas of emerging technologies.

BRIEF SUMMARY OF THE EMBODIMENTS

Embodiment 1 relates to a composition comprising:
A) one or more resin-linear organosiloxane block copolymer compositions comprising:
  40 to 90 mole percent disiloxy units of the formula $[R^1{}_2SiO_{2/2}]$,
  10 to 60 mole percent trisiloxy units of the formula $[R^2SiO_{3/2}]$,
  0.5 to 35 mole percent silanol groups [≡SiOH];
  wherein:
    each $R^1$, at each occurrence, is independently a $C_1$ to $C_{30}$ hydrocarbyl,
    $R^2$, at each occurrence, is independently a $C_1$ to $C_{20}$ hydrocarbyl;
  wherein:
    the disiloxy units $[R^1{}_2SiO_{2/2}]$ are arranged in linear blocks having an average of from 10 to 400 disiloxy units $[R^1{}_2SiO_{2/2}]$ per linear block,
    the trisiloxy units $[R^2SiO_{3/2}]$ are arranged in non-linear blocks having a molecular weight of at least 500 g/mole, and at least 30% of the non-linear blocks are crosslinked with each other, each linear block is linked to at least one non-linear block, and
    the organosiloxane block copolymer has a weight average molecular weight ($M_w$) of at least 20,000 g/mole; and
B) one or more organopolysiloxanes having the formula:

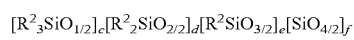

wherein:
  each $R^2$ is independently a $C_1$ to $C_{20}$ hydrocarbyl, and the subscripts c, d, e, and f represent the mole fraction of each siloxy unit present in the organopolysiloxane and range as follows:
    c is about 0 to about 0.6,
    d is about 0 to about 1,
    e is about 0 to about 1,
    f is about 0 to about 0.6,
    with the provisos that d+e+f>0 and c+d+e+f≈1; wherein the weight ratio of component A) to component B) may vary from 99.5/0.5 to 10/90.

Embodiment 2 relates to the composition of Embodiment 1, wherein the weight ratio of component A) to component B) is about 99.5/0.5.

Embodiment 3 relates to the composition of Embodiment 1, wherein B) the organopolysiloxane is a phenyl silsesquioxane resin.

Embodiment 4 relates to the composition of Embodiment 3, wherein the phenyl silsesquioxane resin comprises at least 60 mole percent of $(C_6H_5)SiO_{3/2}$ siloxy units.

Embodiment 5 relates to the composition of Embodiment 3, wherein the phenyl silsesquioxane resin consists essentially of $(C_6H_5)SiO_{3/2}$ siloxy units.

Embodiment 6 relates to the composition of Embodiment 1, wherein B) the organopolysiloxane is a polydiorganosiloxane.

Embodiment 7 relates to the composition of Embodiment 6, wherein the polydiorganosiloxane is polymethylphenylsiloxane.

Embodiment 8 relates to the composition of Embodiment 6, wherein the polydiorganosiloxane has the formula

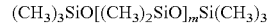

wherein m is ≥1.

Embodiment 9 relates to the composition of Embodiment 6, wherein the polydiorganosiloxane has the formula

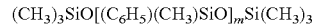

wherein m is ≥1.

Embodiment 10 relates to the composition of Embodiment 6, wherein the polydiorganosiloxane has the formula

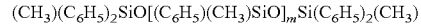

wherein m is ≥1.

Embodiment 11 relates to the composition of Embodiment 6, wherein the polydiorganosiloxane has the formula

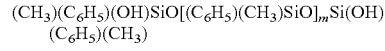

wherein m is ≥1.

Embodiment 12 relates to the composition of Embodiment 6, wherein the polydiorganosiloxane has the formula

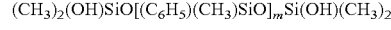

wherein m is ≥1.

Embodiment 13 relates to the composition of Embodiments 8-12, wherein m is an integer from 1 to 200.

Embodiment 14 relates to the composition of Embodiment 1, wherein A) and/or B) further comprises a solvent.

Embodiment 15 relates to the composition of Embodiment 1, wherein B) the organopolysiloxane is a cyclic polydiorganosiloxane.

Embodiment 16 relates to the composition of Embodiment 15, wherein the cyclic polydiorganosiloxane has the formula:

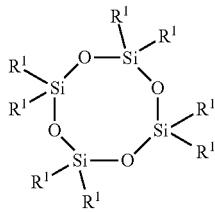

wherein each $R^1$, at each occurrence, is independently a $C_1$ to $C_{30}$ hydrocarbyl.

Embodiment 17 relates to the composition of Embodiment 16, wherein each $R^1$, at each occurrence, is independently methyl or phenyl.

Embodiment 18 relates to the composition of Embodiments 1-11, wherein, wherein the composition is curable.

Embodiment 19 relates to a solid film composition comprising a curable composition of Embodiment 18.

Embodiment 20 relates to the cured product of composition of Embodiment 19.

Embodiment 21 relates to the solid film compositions of Embodiment 19, wherein the solid composition has an optical transmittance of at least 95%.

Embodiment 22 relates to an LED encapsulant comprising the compositions of Embodiments 1-21.

Embodiment 23 relates to a method for increasing the flexibility of a solid resin-linear organosiloxane block copolymer composition comprising combining one or more resin-linear organosiloxane block copolymer compositions and one or more organopolysiloxanes having the formula:

$$[R^2{}_3SiO_{1/2}]_c[R^2{}_2SiO_{2/2}]_d[R^2SiO_{3/2}]_e[SiO_{4/2}]_f$$

wherein:
the subscripts c, d, e, and f represent the mole fraction of each siloxy unit present in the organopolysiloxane and range as follows:
c is about 0 to about 0.6,
d is about 0 to about 1,
e is about 0 to about 1,
f is about 0 to about 0.6,
with the provisos that d+e+f>0, and c+d+e+f≈1,
each $R^2$, at each occurrence, is independently a $C_1$ to $C_{20}$ hydrocarbyl group,
wherein the weight ratio of the organosiloxane block copolymer composition to the organopolysiloxane may vary from 90/10 to 10/90.

Embodiment 24 relates to a method for reducing the viscosity of a solid resin-linear organosiloxane block copolymer composition comprising combining one or more resin-linear organosiloxane block copolymer compositions and one or more organopolysiloxanes having the formula:

$$[R^2{}_3SiO_{1/2}]_c[R^2{}_2SiO_{2/2}]_d[R^2SiO_{3/2}]_e[SiO_{4/2}]_f$$

wherein:
the subscripts c, d, e, and f represent the mole fraction of each siloxy unit present in the organopolysiloxane and range as follows:
c is about 0 to about 0.6,
d is about 0 to about 1,
e is about 0 to about 1,
f is about 0 to about 0.6,
with the provisos that d+e+f>0, and c+d+e+f≈1,
each $R^2$, at each occurrence, is independently a $C_1$ to $C_{20}$ hydrocarbyl group,
wherein the weight ratio of the organosiloxane block copolymer composition to the organopolysiloxane may vary from 90/10 to 10/90.

Embodiment 25 relates to a method for reducing the storage modulus of a solid resin-linear organosiloxane block copolymer composition comprising combining one or more resin-linear organosiloxane block copolymer compositions and one or more organopolysiloxanes having the formula:

$$[R^2{}_3SiO_{1/2}]_c[R^2{}_2SiO_{2/2}]_d[R^2SiO_{3/2}]_e[SiO_{4/2}]_f$$

wherein:
the subscripts c, d, e, and f represent the mole fraction of each siloxy unit present in the organopolysiloxane and range as follows:
c is about 0 to about 0.6,
d is about 0 to about 1,
e is about 0 to about 1,
f is about 0 to about 0.6,
with the provisos that d+e+f>0, and c+d+e+f≈1,
each $R^2$, at each occurrence, is independently a $C_1$ to $C_{20}$ hydrocarbyl group,
wherein the weight ratio of the organosiloxane block copolymer composition to the organopolysiloxane may vary from 90/10 to 10/90.

Embodiment 26 relates to the method of one of Embodiments 23-25, where the organosiloxane block copolymer composition comprises one or more resin-linear organosiloxane block copolymers comprising:
40 to 90 mole percent disiloxy units of the formula $[R^1{}_2SiO_{2/2}]$,
10 to 60 mole percent trisiloxy units of the formula $[R^2SiO_{3/2}]$,
0.5 to 35 mole percent silanol groups [≡SiOH];
wherein:
each $R^1$, at each occurrence, is independently a $C_1$ to $C_{30}$ hydrocarbyl,
each $R^2$, at each occurrence, is independently a $C_1$ to $C_{20}$ hydrocarbyl;
wherein:
the disiloxy units $[R^1{}_2SiO_{2/2}]$ are arranged in linear blocks having an average of from 10 to 400 disiloxy units $[R^1{}_2SiO_{2/2}]$ per linear block,
the trisiloxy units $[R^2SiO_{3/2}]$ are arranged in non-linear blocks having a molecular weight of at least 500 g/mole, and at least 30% of the non-linear blocks are crosslinked with each other, each linear block is linked to at least one non-linear block, and
the organosiloxane block copolymer has weight average molecular weight ($M_W$) of at least 20,000 g/mole.

Embodiment 27 relates to the method of Embodiment 25, wherein the storage modulus is reduced to a value ranging from about 0.5 to about 50 kPa.

DETAILED DESCRIPTION OF THE EMBODIMENTS

The present disclosure provides compositions containing certain "resin linear" organosiloxane block copolymers, as well as curable and solid compositions comprising "resin linear" organosiloxane block copolymers and organopolysiloxanes. When "resin linear" organosiloxane block copolymers are combined with various amounts of a linear or resinous component, the level of flow, cure, hardness, and/or toughness of a particular end use coating formulation can be tuned.

Organopolysiloxanes are polymers containing siloxy units independently selected from $[R_3SiO_{1/2}]$, $[R_2SiO_{2/2}]$, $[RSiO_{3/2}]$, or $[SiO_{4/2}]$ siloxy units, where R may be, e.g., an organic group. These siloxy units are commonly referred to as M, D, T, and Q units respectively. These siloxy units can be combined in various manners to form cyclic, linear, or branched structures. The chemical and physical properties of the resulting polymeric structures vary depending on the number and type of siloxy units in the organopolysiloxane. For example, "linear" organopolysiloxanes may contain mostly D, or $[R_2SiO_{2/2}]$ siloxy units, which results in polydiorganosiloxanes that are fluids of varying viscosities, depending on the "degree of polymerization" or "dp" as indicated by the number of D units in the polydiorganosiloxane. "Linear" organopolysiloxanes may have glass transition temperatures ($T_g$) that are lower than 25° C. "Resin" organopolysiloxanes result when a majority of the siloxy units are selected from T or Q siloxy units. When T siloxy units are predominately used to prepare an organopolysiloxane, the resulting organosiloxane is often referred to as a "resin" or a "silsesquioxane resin." Increasing the amount of T or Q siloxy units in an organopolysiloxane may result in polymers having increasing hardness and/or glass like properties. "Resin" organopolysiloxanes thus have higher $T_g$ values, for example siloxane resins often have $T_g$ values greater than 40° C., e.g., greater than 50° C., greater than 60° C., greater than 70° C., greater than 80° C., greater than 90° C. or greater than 100° C. In some embodiments, $T_g$ for siloxane resins is from about 60° C. to about 100° C., e.g., from about 60° C. to about 80° C., from about 50° C. to about 100° C., from about 50° C. to about 80° C. or from about 70° C. to about 100° C.

Embodiments of the present invention provide compositions comprising:

A) one or more resin-linear organosiloxane block copolymer compositions comprising:
  40 to 90 mole percent disiloxy units of the formula $[R^1_2SiO_{2/2}]$,
  10 to 60 mole percent trisiloxy units of the formula $[R^2SiO_{3/2}]$,
  0.5 to 35 mole percent silanol groups [≡SiOH];
  wherein:
    each $R^1$, at each occurrence, is independently a $C_1$ to $C_{30}$ hydrocarbyl,
    each $R^2$, at each occurrence, is independently a $C_1$ to $C_{20}$ hydrocarbyl;
  wherein:
    the disiloxy units $[R^1_2SiO_{2/2}]$ are arranged in linear blocks having an average of from 10 to 400 disiloxy units $[R^1_2SiO_{2/2}]$ per linear block,
    the trisiloxy units $[R^2SiO_{3/2}]$ are arranged in non-linear blocks having a molecular weight of at least 500 g/mole, and at least 30% of the non-linear blocks are crosslinked with each other, each linear block is linked to at least one non-linear block, and
    the organosiloxane block copolymer has a weight average molecular weight ($M_W$) of at least 20,000 g/mole; and B) one or more organopolysiloxanes having the formula:

$[R^2_3SiO_{1/2}]_c[R^2_2SiO_{2/2}]_d[R^2SiO_{3/2}]_e[SiO_{4/2}]_f$ wherein:
    each $R^2$, at each occurrence, is independently a $C_1$ to $C_{20}$ hydrocarbyl, and
    the subscripts c, d, e, and f represent the mole fraction of each siloxy unit present in the organopolysiloxane and range as follows:
      c is about 0 to about 0.6,
      d is about 0 to about 1,
      e is about 0 to about 0 to 1,
      f is about 0 to about 0 to 0.6,
      with the provisos that d+e+f>0 and c+d+e+f≈1;
  wherein the weight ratio of component A) to component B) may vary from 90/10 to 10/90.

Component A): The Resin-Linear Organosiloxane Block Copolymer Compositions

As used herein "organosiloxane block copolymers" or "resin-linear organosiloxane block copolymers" refer to organopolysiloxanes containing "linear" D siloxy units in combination with "resin" T siloxy units. See, e.g., Published PCT Appl. Nos. WO2012/040302; WO2012/040305; WO2012/040367; WO2012/040453; and WO2012/040457, which are incorporated by reference as if fully set forth herein. In some embodiments, the organosiloxane copolymers are "block" copolymers, as opposed to "random" copolymers. As such, the term "resin-linear organosiloxane block copolymers" refers broadly to organopolysiloxanes containing D and T siloxy units, where the D units (i.e., $[R^1_2SiO_{2/2}]$ units) are primarily bonded together to form polymeric chains having, in some embodiments, an average of from 10 to 400 D units (e.g., an average of from about 10 to about 350 D units; about 10 to about 300 D units; about 10 to about 200 D units; about 10 to about 100 D units; about 50 to about 400 D units; about 100 to about 400 D units; about 150 to about 400 D units; about 200 to about 400 D units; about 300 to about 400 D units; about 50 to about 300 D units; about 100 to about 300 D units; about 150 to about 300 D units; about 200 to about 300 D units; about 100 to about 150 D units, about 115 to about 125 D units, about 90 to about 170 D units or about 110 to about 140 D units), which are referred herein as "linear blocks."

The T units (i.e., $[R^2SiO_{3/2}]$) are, in some embodiments, primarily bonded to each other to form branched polymeric chains, which are referred to as "non-linear blocks." In some embodiments, a significant number of these non-linear blocks may further aggregate to form "nano-domains" when solid forms of the block copolymer are provided. In some embodiments, these nano-domains form a phase separate from a phase formed from linear blocks having D units, such that a resin-rich phase forms. In some embodiments, the disiloxy units $[R^1_2SiO_{2/2}]$ are arranged in linear blocks having an average of from 10 to 400 disiloxy units $[R^1_2SiO_{2/2}]$ per linear block (e.g., an average of from about 10 to about 350 D units; about 10 to about 300 D units; about 10 to about 200 D units; about 10 to about 100 D units; about 50 to about 400 D units; about 100 to about 400 D units; about 150 to about 400 D units; about 200 to about 400 D units; about 300 to about 400 D units; about 50 to about 300 D units; about 100 to about 300 D units; about 150 to about 300 D units; about 200 to about 300 D units; about 100 to about 150 D units, about 115 to about 125 D units, about 90 to about 170 D units or about 110 to about 140 D units), and the trisiloxy units $[R^2SiO_{3/2}]$ are arranged in non-linear blocks having a molecular weight of at least 500 g/mole and at least 30% of the non-linear blocks are crosslinked with each other.

As used herein, "nano-domains" refers broadly to those phase regions within a solid block copolymer composition that are phase separated within the solid block copolymer compositions and possess at least one dimension sized from 1 to 100 nanometers. The nano-domains may vary in shape, providing at least one dimension of the nano-domain is sized from 1 to 100 nanometers. Thus, the nano-domains may be regular or irregularly shaped. The nano-domains may be spherically shaped, tubular shaped, and in some instances lamellar shaped. The structural ordering of the disiloxy and trisiloxy units in the solid block copolymers of the present disclosure, and characterization of the nano-domains, may be determined explicitly using certain analytical techniques such as Transmission Electron Microscopic (TEM) techniques, Atomic Force Microscopy (AFM), Small Angle Neutron Scattering, Small Angle X-Ray Scattering, and Scanning Electron Microscopy.

Alternatively, the structural ordering of the disiloxy and trisiloxy units in the block copolymer, and formation of nano-domains, may be implied by characterizing certain physical properties of coatings resulting from the present organosiloxane block copolymers. For example, the present organosiloxane copolymers may provide coatings that have an optical transmittance of visible light greater than 95%. One skilled in the art recognizes that such optical clarity is possible (other than refractive index matching of the two phases) only when visible light is able to pass through such a medium and not be diffracted by particles (or domains as used herein) having a size greater than 150 nanometers. As the particle size, or domains further decreases, the optical clarity may be further improved. Thus, coatings derived from the present organosiloxane copolymers may have an optical transmittance of visible light of at least 95%, e.g., at least 96%; at least 97%; at least 98%; at least 99%; or 100% transmittance of visible light. As used herein, the term "visible light" includes light with wavelengths above 350 nm.

In some embodiments, the non-linear blocks have a number average molecular weight of at least 500 g/mole, e.g., at least 1000 g/mole, at least 2000 g/mole, at least 3000 g/mole or at least 4000 g/mole; or have a molecular weight of from about 500 g/mole to about 4000 g/mole, from about 500 g/mole to about 3000 g/mole, from about 500 g/mole to about 2000 g/mole, from about 500 g/mole to about 1000 g/mole, from about 1000 g/mole to 2000 g/mole, from about 1000 g/mole to about 1500 g/mole, from about 1000 g/mole to about 1200 g/mole, from about 1000 g/mole to 3000 g/mole, from about 1000 g/mole to about 2500 g/mole, from about 1000 g/mole to about 4000 g/mole, from about 2000 g/mole to about 3000 g/mole or from about 2000 g/mole to about 4000 g/mole.

In some embodiments, at least 30% of the non-linear blocks are crosslinked with each other, e.g., at least 40% of the non-linear blocks are crosslinked with each other; at least 50% of the non-linear blocks are crosslinked with each other; at least 60% of the non-linear blocks are crosslinked with each other; at least 70% of the non-linear blocks are crosslinked with each other; or at least 80% of the non-linear blocks are crosslinked with each other, wherein all of the percentages given herein to indicate percent non-linear blocks that are crosslinked are in weight percent. In other embodiments, from about 30% to about 80% of the non-linear blocks are crosslinked with each other; from about 30% to about 70% of the non-linear blocks are crosslinked with each other; from about 30% to about 60% of the non-linear blocks are crosslinked with each other; from about 30% to about 50% of the non-linear blocks are crosslinked with each other; from about 30% to about 40% of the non-linear blocks are crosslinked with each other; from about 40% to about 80% of the non-linear blocks are crosslinked with each other; from about 40% to about 70% of the non-linear blocks are crosslinked with each other; from about 40% to about 60% of the non-linear blocks are crosslinked with each other; from about 40% to about 50% of the non-linear blocks are crosslinked with each other; from about 50% to about 80% of the non-linear blocks are crosslinked with each other; from about 50% to about 70% of the non-linear blocks are crosslinked with each other; from about 55% to about 70% of the non-linear blocks are crosslinked with each other, from about 50% to about 60% of the non-linear blocks are crosslinked with each other; from about 60% to about 80% of the non-linear blocks are crosslinked with each other; or from about 60% to about 70% of the non-linear blocks are crosslinked with each other.

The organosiloxane block copolymers (e.g., those comprising 40 to 90 mole percent disiloxy units of the formula $[R^1_2SiO_{2/2}]$ and 10 to 60 mole percent trisiloxy units of the formula $[R^2SiO_{3/2}]$) may be represented by the formula $[R^1_2SiO_{2/2}]_a[R^2SiO_{3/2}]_b$ where the subscripts a and b represent the mole fractions of the siloxy units in the copolymer, a is about 0.4 to about 0.9,
  alternatively about 0.5 to about 0.9,
    alternatively about 0.6 to about 0.9,
b is about 0.1 to about 0.6,
  alternatively about 0.1 to about 0.5,
    alternatively about 0.1 to about 0.4,
each $R^1$, at each occurrence, is independently a $C_1$ to $C_{30}$ hydrocarbyl,
each $R^2$, at each occurrence, is independently a $C_1$ to $C_{20}$ hydrocarbyl.

In some embodiments, the organosiloxane block copolymers of the embodiments described herein comprise 40 to 90 mole percent disiloxy units of the formula $[R^1_2SiO_{2/2}]$, e.g., 50 to 90 mole percent disiloxy units of the formula $[R^1_2SiO_{2/2}]$; 60 to 90 mole percent disiloxy units of the formula $[R^1_2SiO_{2/2}]$; 65 to 90 mole percent disiloxy units of the formula $[R^1_2SiO_{2/2}]$; 70 to 90 mole percent disiloxy units of the formula $[R^1_2SiO_{2/2}]$; or 80 to 90 mole percent disiloxy units of the formula $[R^1_2SiO_{2/2}]$; 40 to 80 mole percent disiloxy units of the formula $[R^1_2SiO_{2/2}]$; 40 to 70 mole percent disiloxy units of the formula $[R^1_2SiO_{2/2}]$; 40 to 60 mole percent disiloxy units of the formula $[R^1_2SiO_{2/2}]$; 40 to 50 mole percent disiloxy units of the formula $[R^1_2SiO_{2/2}]$; 50 to 80 mole percent disiloxy units of the formula $[R^1_2SiO_{2/2}]$; 50 to 70 mole percent disiloxy units of the formula $[R^1_2SiO_{2/2}]$; 50 to 60 mole percent disiloxy units of the formula $[R^1_2SiO_{2/2}]$; 60 to 80 mole percent disiloxy units of the formula $[R^1_2SiO_{2/2}]$; 60 to 70 mole percent disiloxy units of the formula $[R^1_2SiO_{2/2}]$; or 70 to 80 mole percent disiloxy units of the formula $[R^1_2SiO_{2/2}]$.

In some embodiments, the organosiloxane block copolymers of the embodiments described herein comprise 10 to 60 mole percent trisiloxy units of the formula $[R^2SiO_{3/2}]$, e.g., 10 to 20 mole percent trisiloxy units of the formula $[R^2SiO_{3/2}]$; 10 to 30 mole percent trisiloxy units of the formula $[R^2SiO_{3/2}]$; 10 to 35 mole percent trisiloxy units of the formula $[R^2SiO_{3/2}]$; 10 to 40 mole percent trisiloxy units of the formula $[R^2SiO_{3/2}]$; 10 to 50 mole percent trisiloxy units of the formula $[R^2SiO_{3/2}]$; 20 to 30 mole percent trisiloxy units of the formula $[R^2SiO_{3/2}]$; 20 to 35 mole percent trisiloxy units of the formula $[R^2SiO_{3/2}]$; 20 to 40 mole percent trisiloxy units of the formula $[R^2SiO_{3/2}]$; 20 to 50 mole percent trisiloxy units of the formula $[R^2SiO_{3/2}]$; 20 to 60 mole percent trisiloxy units of the formula $[R^2SiO_{3/2}]$; 30 to 40 mole percent trisiloxy units of the formula $[R^2SiO_{3/2}]$; 30 to 50 mole percent trisiloxy units of the formula $[R^2SiO_{3/2}]$; 30 to 60 mole percent trisiloxy units of the formula $[R^2SiO_{3/2}]$; 40 to 50 mole percent trisiloxy units of the formula $[R^2SiO_{3/2}]$; or 40 to 60 mole percent trisiloxy units of the formula $[R^2SiO_{3/2}]$.

It should be understood that the organosiloxane block copolymers of the embodiments described herein may contain additional siloxy units, such as M siloxy units, Q siloxy units, other unique D or T siloxy units (for example, having organic groups other than $R^1$ or $R^2$), provided that the organosiloxane block copolymer contains the mole fractions of the disiloxy and trisiloxy units as described herein. In other words, the sum of the mole fractions as designated by subscripts a and b, do not necessarily have to sum to one. The sum of a+b may be less than one to account for minor amounts of other siloxy units that may be present in the organosiloxane block copolymer. Alternatively, the sum of a+b is greater than 0.6, alternatively greater than 0.7, alternatively greater than 0.8, or alternatively greater than 0.9. In some embodiments, the sum of a+b is from about 0.6 to about 0.9, e.g., from about 0.6 to about 0.8, from about 0.6 to about 0.7, from about 0.7 to about 0.9, from about 0.7 to about 0.8, or from about 0.8 to about 0.9.

In one embodiment, the organosiloxane block copolymer consists essentially of the disiloxy units of the formula $[R^1{}_2SiO_{2/2}]$ and trisiloxy units of the formula $[R^2SiO_{3/2}]$, while also containing 0.5 to 25 mole percent silanol groups [≡SiOH] (e.g., 0.5 to 5 mole percent, 0.5 to 10 mole percent, 0.5 to 15 mole percent, 0.5 to 20 mole percent, 5 to 10 mole percent, 5 to 15 mole percent, 5 to 20 mole percent, 5 to 25 mole percent, 10 to 15 mole percent 10 to 20 mole percent, 10 to 25 mole percent, 15 to 20 mole percent, 15 to 25 mole percent, or 20 to 25 mole percent), where $R^1$ and $R^2$ are as defined herein. Thus, in some embodiments, the sum of a+b (when using mole fractions to represent the amount of disiloxy and trisiloxy units in the copolymer) is greater than 0.95, alternatively greater than 0.98.

In some embodiments, the resin-linear organosiloxane block copolymers also contain silanol groups (≡SiOH). The amount of silanol groups present on the organosiloxane block copolymer may vary from 0.5 to 35 mole percent silanol groups [≡SiOH], alternatively from 2 to 32 mole percent silanol groups [≡SiOH], alternatively from 8 to 22 mole percent silanol groups [≡SiOH].

The silanol groups may be present on any siloxy units within the organosiloxane block copolymer. The amount described herein represent the total amount of silanol groups found in the organosiloxane block copolymer. In some embodiments, the majority (e.g., greater than 75%, greater than 80%, greater than 90%; from about 75% to about 90%, from about 80% to about 90%, or from about 75% to about 85%) of the silanol groups will reside on the trisiloxy units, i.e., the resin component of the block copolymer. Although not wishing to be bound by any theory, the silanol groups present on the resin component of the organosiloxane block copolymer allows for the block copolymer to further react or cure at elevated temperatures.

At each occurrence, each $R^1$ in the above disiloxy unit is independently a $C_1$ to $C_{30}$ hydrocarbyl, where the hydrocarbyl group may independently be an alkyl, aryl, or alkylaryl group. Each $R^1$, at each occurrence, may independently be a $C_1$ to $C_{30}$ alkyl group, alternatively each $R^1$, at each occurrence, may independently be a $C_1$ to $C_{18}$ alkyl group. Alternatively, at each occurrence, each $R^1$ may independently be a $C_1$ to $C_6$ alkyl group such as methyl, ethyl, propyl, butyl, pentyl, or hexyl. Alternatively, at each occurrence, each $R^1$ may independently be methyl. Each $R^1$, at each occurrence, may independently be an aryl group, such as phenyl, naphthyl or an anthryl group. Alternatively, at each occurrence, each $R^1$ may independently be any combination of the aforementioned alkyl or aryl groups. Alternatively, at each occurrence, each $R^1$ may be phenyl or methyl, such that, in some embodiments, each disiloxy unit may have two alkyl groups (e.g., two methyl groups); two aryl groups (e.g., two phenyl groups); or an alkyl (e.g., methyl) and an aryl group (e.g., phenyl).

At each occurrence, each $R^2$ in the above trisiloxy unit is independently a $C_1$ to $C_{20}$ hydrocarbyl (e.g., $C_1$ to $C_{10}$ hydrocarbyl), where the hydrocarbyl group may independently be an alkyl, aryl, or alkylaryl group. Each $R^2$, at each occurrence, may independently be a $C_1$ to $C_{20}$ (e.g., $C_1$ to $C_{10}$ hydrocarbyl)alkyl group, alternatively each $R^2$, at each occurrence, may independently be a $C_1$ to $C_8$ alkyl group. Alternatively, at each occurrence, each $R^2$ may independently be a $C_1$ to $C_6$ alkyl group such as methyl, ethyl, propyl, butyl, pentyl, or hexyl. Alternatively, at each occurrence, each $R^2$ may independently be methyl. Each $R^2$, at each occurrence, may independently be an aryl group, such as phenyl, naphthyl or an anthryl group. Alternatively, at each occurrence, each $R^2$ may independently be any combination of the aforementioned alkyl or aryl groups. Alternatively, at each occurrence, each $R^2$ may independently be phenyl or methyl, such that, in some embodiments, each disiloxy unit may have two alkyl groups (e.g., two methyl groups); two aryl groups (e.g., two phenyl groups); or an alkyl (e.g., methyl) and an aryl group (e.g., phenyl).

As used herein, hydrocarbyl also includes substituted hydrocarbyls. "Substituted" as used herein refers broadly to replacement of one or more of the hydrogen atoms of the group with substituents known to those skilled in the art and resulting in a stable compound as described herein. Examples of suitable substituents include, but are not limited to, alkyl, alkenyl, alkynyl, cycloalkyl, aryl, alkaryl, hydroxy, alkoxy, aryloxy, carboxy (i.e., $CO_2H$), carboxyalkyl, carboxyaryl, cyano, nitro and the like. Substituted hydrocabyl also includes halogen substituted hydrocarbyls, where the halogen may be fluorine, chlorine, bromine or combinations thereof.

In some embodiments, the organosiloxane block copolymer comprised in component A) includes fluorinated organosiloxane block copolymers described in U.S. Provisional Patent Appl. Ser. No. 61/608,732, filed Mar. 9, 2012; and PCT Appl. No. PCT/US2013/027904 the entire disclosures of both which are incorporated by reference as if fully set forth herein. The fluorinated organosiloxane block copolymers may be used in addition to, or in place of the non-fluorinated analogs described herein.

The formula $[R^1{}_2SiO_{2/2}]_a[R^2SiO_{3/2}]_b$, and related formulae using mole fractions, as used herein to describe the organosiloxane block copolymers, does not indicate structural ordering of the disiloxy $[R^1{}_2SiO_{2/2}]$ and trisiloxy $[R^2SiO_{3/2}]$ units in the copolymer. Rather, this formula is meant to provide a convenient notation to describe the relative amounts of the two units in the copolymer, as per the mole fractions described herein via the subscripts a and b. The mole fractions of the various siloxy units in the present organosiloxane block copolymers, as well as the silanol content, may be readily determined by $^{29}Si$ NMR techniques.

The organosiloxane block copolymers of the embodiments described herein have a weight average molecular weight ($M_w$) of at least 20,000 g/mole, alternatively a weight average molecular weight of at least 40,000 g/mole, alternatively a weight average molecular weight of at least 50,000 g/mole, alternatively a weight average molecular weight of at least 60,000 g/mole, alternatively a weight average molecular weight of at least 70,000 g/mole, or alternatively a weight average molecular weight of at least 80,000 g/mole. In some embodiments, the organosiloxane block copolymers of the embodiments described herein have a weight average molecular weight ($M_w$) of from about 20,000 g/mole to about 250,000 g/mole or from about 100,000 g/mole to about 250,000 g/mole, alternatively a weight average molecular weight of from about 40,000 g/mole to about 100,000 g/mole, alternatively a weight average molecular weight of from about 50,000 g/mole to about 100,000 g/mole, alternatively a weight average molecular weight of from about 50,000 g/mole to about 80,000 g/mole, alternatively a weight average molecular weight of from about 50,000 g/mole to about 70,000 g/mole, alternatively a weight average molecular weight of from about 50,000 g/mole to about 60,000 g/mole. In some embodiments, the organosiloxane block copolymers of the embodiments described herein have a number average molecular weight ($M_n$) of from about 15,000 to about 50,000 g/mole; from about 15,000 to about 30,000 g/mole; from about 20,000 to about 30,000 g/mole; or from about 20,000 to about 25,000 g/mole. The average molecular weight may be readily determined using Gel Permeation Chromatography (GPC) techniques.

In some embodiments, the structural ordering of the disiloxy and trisiloxy units may be further described as follows: the disiloxy units [$R^1_2SiO_{2/2}$] are arranged in linear blocks having an average of from 10 to 400 disiloxy units [$R^1_2SiO_{2/2}$] per linear block, and the trisiloxy units [$R^2SiO_{3/2}$] are arranged in non-linear blocks having a molecular weight of at least 500 g/mole. Each linear block is linked to at least one non-linear block in the block copolymer. Furthermore, at least 30% of the non-linear blocks are crosslinked with each other, alternatively at least at 40% of the non-linear blocks are crosslinked with each other, alternatively at least at 50% of the non-linear blocks are crosslinked with each other.

In other embodiments, from about 30% to about 80% of the non-linear blocks are crosslinked with each other; from about 30% to about 70% of the non-linear blocks are crosslinked with each other; from about 30% to about 60% of the non-linear blocks are crosslinked with each other; from about 30% to about 50% of the non-linear blocks are crosslinked with each other; from about 30% to about 40% of the non-linear blocks are crosslinked with each other; from about 40% to about 80% of the non-linear blocks are crosslinked with each other; from about 40% to about 70% of the non-linear blocks are crosslinked with each other; from about 40% to about 60% of the non-linear blocks are crosslinked with each other; from about 40% to about 50% of the non-linear blocks are crosslinked with each other; from about 50% to about 80% of the non-linear blocks are crosslinked with each other; from about 50% to about 70% of the non-linear blocks are crosslinked with each other; from about 50% to about 60% of the non-linear blocks are crosslinked with each other; from about 60% to about 80% of the non-linear blocks are crosslinked with each other; or from about 60% to about 70% of the non-linear blocks are crosslinked with each other.

The crosslinking of the non-linear blocks may be accomplished via a variety of chemical mechanisms and/or moieties. For example, crosslinking of non-linear blocks within the block copolymer may result from the condensation of residual silanol groups present in the non-linear blocks of the copolymer and/or via hydrosylilation between, e.g., Si—H bonds and double bonds present on non-linear blocks. Crosslinking of the non-linear blocks within the block copolymer may also occur between "free resin" components and the non-linear blocks via silanol condensation and/or hydrosilylation. "Free resin" components may be present in the block copolymer compositions as a result of using an excess amount of an organosiloxane resin during the preparation of the block copolymer. The free resin component may crosslink with the non-linear blocks by condensation of the residual silanol groups present on the non-blocks and on the free resin. The free resin may provide crosslinking by reacting with lower molecular weight compounds added as crosslinkers. The free resin, when present, may be present in an amount of from about 10% to about 20% by weight of the organosiloxane block copolymers of the embodiments described herein, e.g., from about 15% to about 20% by weight organosiloxane block copolymers of the embodiments described herein. The free resin may provide crosslinking by reacting with lower molecular weight compounds added as crosslinkers.

Alternatively, certain compounds may be added during the preparation of the block copolymer to specifically crosslink the non-resin blocks. These crosslinking compounds may include an organosilane having the formula $R^5_qSiX_{4-q}$, which is added during the formation of the block copolymer, where $R^5$ is a $C_1$ to $C_8$ hydrocarbyl or a $C_1$ to $C_8$ halogen-substituted hydrocarbyl; X is a hydrolyzable group; and q is 0, 1, or 2. $R^5$ is a $C_1$ to $C_8$ hydrocarbyl or a $C_1$ to $C_8$ halogen-substituted hydrocarbyl, or alternatively $R^5$ is a $C_1$ to $C_8$ alkyl group, or alternatively a phenyl group, or alternatively $R^5$ is methyl, ethyl, or a combination of methyl and ethyl. X is any hydrolyzable group, alternatively X may be an oximo, acetoxy, halogen atom, hydroxyl (OH), or an alkoxy group.

In one embodiment, the organosilane having the formula $R^5_qSiX_{4-q}$ is an alkyltriacetoxysilane, such as methyltriacetoxysilane, ethyltriacetoxysilane, or a combination of both. Commercially available representative alkyltriacetoxysilanes include ETS-900 (Dow Corning Corp., Midland, Mich.).

Other suitable, non-limiting organosilanes useful as crosslinkers include; methyl tris(methylethylketoxime)silane (MTO), methyl triacetoxysilane, ethyl triacetoxysilane, tetraacetoxysilane, tetraoximesilane, dimethyl diacetoxysilane, dimethyl dioximesilane, and methyl tris(methylmethylketoxime)silane.

The crosslinks within the block copolymer may primarily be siloxane bonds, ≡Si—O—Si≡, resulting from, e.g., the condensation of silanol groups, as discussed herein.

The amount of crosslinking in the block copolymer may be estimated by determining the average molecular weight of the block copolymer, such as with GPC techniques. In some embodiments, crosslinking the block copolymer increases its average molecular weight. Thus, an estimation of the extent of crosslinking may be made, given the average molecular weight of the block copolymer, the selection of the linear siloxy component (that is the chain length as indicated by its degree of polymerization), and the molecular weight of the non-linear block (which is primarily controlled by the selection of the selection of the organosiloxane resin used to prepare the block copolymer).

In some embodiments, component A) may further comprise an organic solvent. The organic solvent is, in some embodiments, an aromatic solvent, such as benzene, toluene, xylene, or combinations thereof. Such solutions, in some embodiments, containing from about 50 wt % to about 80 wt % solids, e.g., from about 60 wt % to about 80 wt %, from about 70 wt % to about 80 wt % or from about 75 wt % to about 80 wt % solids. In some embodiments, the solvent is toluene. In some embodiments, such solutions will have a viscosity of from about 1500 cSt to about 10000 cSt at 25° C. or from about 1000 cSt to about 10000 cSt at 25° C., e.g., from about 1500 cSt to about 6000 cSt, from about 1000 cSt to about 4000 cSt or from about 2000 cSt to about 3000 cSt at 25° C.

Component A) may further contain an organosiloxane resin (e.g., free resin that is not part of the block copolymer). The organosiloxane resin present in these compositions, in some embodiments, may be the organosiloxane resin used to prepare the organosiloxane block copolymer. Thus, the organosiloxane resin may comprise at least 60 mole % of $[R^2SiO_{3/2}]$ siloxy units in its formula (e.g., at least 70 mole % of $[R^2SiO_{3/2}]$ siloxy units, at least 80 mole % of $[R^2SiO_{3/2}]$ siloxy units, at least 90 mole % of $[R^2SiO_{3/2}]$ siloxy units, or 100 mole % of $[R^2SiO_{3/2}]$ siloxy units; or 60-100 mole % $[R^2SiO_{3/2}]$ siloxy units, 60-90 mole % $[R^2SiO_{3/2}]$ siloxy units or 70-80 mole % $[R^2SiO_{3/2}]$ siloxy units), where each $R^2$ is independently a $C_1$ to $C_{20}$ hydrocarbyl. Alternatively, the organosiloxane resin is a silsesquioxane resin, or alternatively a phenyl silsesquioxane resin.

In one embodiment, component A), which, in some embodiments comprises curable compositions, may contain a cure catalyst. The cure catalyst may be selected from any catalyst known in the art to effect condensation cure of organosiloxanes, such as various tin or titanium catalysts. Condensation catalyst can be any condensation catalyst that may be used to promote condensation of silicon bonded hydroxy (=silanol) groups to form Si—O—Si linkages. Examples include, but are not limited to, amines and complexes of lead, tin, titanium, zinc, and iron. Other examples include, but are not limited to basic compounds, such as trimethylbenzylammonium hydroxide, tetramethylammonium hydroxide, n-hexylamine, tributylamine, diazabicycloundecene (DBU) and dicyandiamide; and metal-containing compounds such as tetraisopropyl titanate, tetrabutyl titanate, titanium acetylacetonate, aluminum triisobutoxide, aluminum triisopropoxide, zirconium tetra(acetylacetonato), zirconium tetrabutylate, cobalt octylate, cobalt acetylacetonato, iron acetylacetonato, tin acetylacetonate, dibutyltin octylate, dibutyltin laurate, zinc octylate, zinc bezoate, zinc p-tert-butylbenzoate, zinc laurate, zinc stearate, aluminium phosphate, and alminium triisopropoxide; organic titanium chelates such as aluminium trisacetylacetonate, aluminium bisethylacetoacetate monoacetylacetonate, diisopropoxybis (ethylacetoacetate)titanium, and diisopropoxybis(ethylacetoacetate)titanium. In some embodiments, the condensation catalysts include zinc octylate, zinc bezoate, zinc p-tert-butylbenzoate, zinc laurate, zinc stearate, aluminium phosphate, and aluminum triisopropoxide. See, e.g., U.S. Pat. No. 8,193,269, the entire disclosure of which is incorporated by reference as if fully set forth herein. Other examples of condensation catalysts include, but are not limited to aluminum alkoxides, antimony alkoxides, barium alkoxides, boron alkoxides, calcium alkoxides, cerium alkoxides, erbium alkoxides, gallium alkoxides, silicon alkoxides, germanium alkoxides, hafnium alkoxides, indium alkoxides, iron alkoxides, lanthanum alkoxides, magnesium alkoxides, neodymium alkoxides, samarium alkoxides, strontium alkoxides, tantalum alkoxides, titanium alkoxides, tin alkoxides, vanadium alkoxide oxides, yttrium alkoxides, zinc alkoxides, zirconium alkoxides, titanium or zirconium compounds, especially titanium and zirconium alkoxides, and chelates and oligo- and polycondensates of the above alkoxides, dialkyltin diacetate, tin(II) octoate, dialkyltin diacylate, dialkyltin oxide and double metal alkoxides. Double metal alkoxides are alkoxides containing two different metals in a particular ratio. In some embodiments, the condensation catalysts include titanium tetraethylate, titanium tetrapropylate, titanium tetraisopropylate, titanium tetrabutylate, titanium tetraisooctylate, titanium isopropylate tristearoylate, titanium truisopropylate stearoylate, titanium diisopropylate distearoylate, zirconium tetrapropylate, zirconium tetraisopropylate, zirconium tetrabutylate. See, e.g., U.S. Pat. No. 7,005,460, the entire disclosure of which is incorporated by reference as if fully set forth herein. In addition, the condensation catalysts include titanates, zirconates and hafnates as described in DE 4427528 C2 and EP 0 639 622 B1, both of which are incorporated by reference as if fully set forth herein.

The organosiloxane block copolymer of the embodiments described herein may be prepared by the methods known in the art, including the methods disclosed in Appl. Nos. WO2012/040302; WO2012/040305; WO2012/040367; WO2012/040453; and WO2012/040457, which are incorporated by reference as if fully set forth herein.

Component B): The Organopolysiloxane

Component B) in an organopolysiloxane having the average formula $[R^2{}_3SiO_{1/2}]_c[R^2{}_2SiO_{2/2}]_d[R^2SiO_{3/2}]_e[SiO_{4/2}]_f$ wherein each $R^2$ is, as defined herein, and is independently a $C_1$ to $C_{20}$ hydrocarbyl; and the subscripts c, d, e, and f represent the mole fraction of each siloxy unit present in the organopolysiloxane and range as follows: c is about 0 to about 0.6, d is about 0 to about 1, e is about 0 to about 1, f is about 0 to about 0.6, with the provisos that d+e+f>0, c+d+e+f≈1. The organopolysiloxane may, in some embodiments, be curable.

In some embodiments, component B) may further comprise an organic solvent. The organic solvent is, in some embodiments, an aromatic solvent, such as benzene, toluene, xylene, or combinations thereof. Such solutions, in some embodiments, containing from about 50 wt % to about 80 wt % solids, e.g., from about 60 wt % to about 80 wt %, from about 70 wt % to about 80 wt % or from about 75 wt % to about 80 wt % solids. In some embodiments, the solvent is toluene. In some embodiments, such solutions will have a viscosity of from about 500 cSt to about 2500 cSt at 25° C., e.g., from about 500 cSt to about 1500 cSt, from about 1000 cSt to about 2500 cSt or from about 500 cSt to about 2000 cSt at 25° C.

The weight average molecular weight ($M_W$) of the organopolysiloxane resin is not limiting, but, in some embodiments, ranges from 1000 to 10000, or alternatively 1500 to 5000 g/mole.

The above average formula used to refer to organopolysiloxanes in component B) using mole fractions does not indicate structural ordering of the various siloxy units in the copolymer. Rather, this formula is meant to provide a convenient notation to describe the relative amounts of the siloxy units in the copolymer, as per the mole fractions described herein via the subscripts. The mole fractions of the various siloxy units in the present organopolysiloxanes, as well as the silanol content, may be readily determined by $^{29}Si$ NMR techniques.

The component B) may be selected from a variety of organopolysiloxanes including substantially "linear" organopolysiloxanes, where a majority (e.g., greater than 60%; greater than 75%, greater than 80%, greater than 90%; from about 75% to about 90%, from about 80% to about 90%, or from about 75% to about 85%) of siloxy units in the organopolysiloxane are $R^2{}_2SiO_{2/2}$ units, and/or substantially "resinous" organopolysiloxanes, where the majority (e.g., greater than 60%; greater than 75%, greater than 80%, greater than 90%; from about 75% to about 90%, from about 80% to about 90%, or from about 75% to about 85%) of siloxy units in the organopolysiloxane are $R^2SiO_{3/2}$ and/or $SiO_{4/2}$ units.

In some embodiments, the organopolysiloxanes added as component B) in the present compositions are in addition to any organopolysiloxanes that may already be present in the resin-linear organosiloxane block copolymer compositions used as component A). In other words, there may be certain instances where the selected organopolysiloxane added as component B) may be an organopolysiloxane that is also present in the component A) composition. For example, the resin-linear organosiloxane block copolymer compositions may contain an organosiloxane resin, which may be present in the composition from using a molar excess of the resin to prepare the organosiloxane block copolymer. If the same organosiloxane resin is added as component B), it may be considered as a "second" organosiloxane resin, added for the purpose of modifying the physical properties of the resin-linear organosiloxane block copolymer compositions. In some embodiments, the organopolysiloxanes added as component B) may be different than any organopolysiloxanes that may already be present in the resin-linear organosiloxane block copolymer compositions used as component A).

In some embodiments, fluorinated analogs of the aforementioned "linear" organopolysiloxanes and/or "resinous" organopolysiloxanes may be used in component B). Examples of such fluorinated analogs include, but are not limited to, those described in U.S. Provisional Patent Appl. Ser. No. 61/608,732, filed Mar. 9, 2012; and PCT Appl. No. PCT/US2013/027904 the entire disclosures of both which are incorporated by reference as if fully set forth herein. Such fluorinated analogs may be used in addition to, or in place of the non-fluorinated analogs of the organopolysiloxanes comprised in component B) described herein.

In some embodiments, cyclic organopolysiloxanes may be used in component B), alone, or in combination with "linear" organopolysiloxanes and/or "resinous" organopolysiloxanes. Representative cyclic organopolysiloxanes include, but are not limited to cyclic organopolysiloxanes of the following formulae P3 and P4:

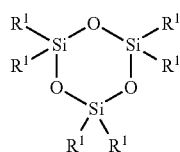

P3

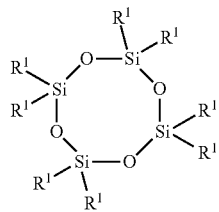

P4 wherein each $R^1$ is the same or different and each $R^1$ is, independently, as defined herein. In some embodiments, each $R^1$ is, independently, methyl or phenyl. In some embodiments, each $R^1$ is methyl. In some embodiments, on each silicon atom one $R^1$ is methyl and the other $R^1$ is phenyl, such that the compound of the formula P3 and the compound P4 would have the formulae P3' and P4'.

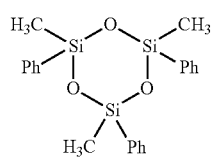

P3'

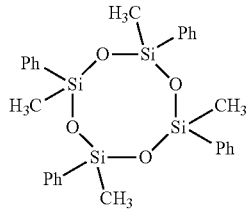

P4'

When present, cyclic organopolysiloxanes are added at from about 0.5 to about 10 wt %, e.g., from about 0.5 to about 3 wt %, from about 0.5 to about 2.5 wt %, from about 0.75 to about 1.5 wt % or from about 1.5 to about 3 wt %.

The incorporation of cyclic organopolysiloxanes into resin-linear organosiloxane block copolymer compositions (i.e., component A; e.g., 45 wt % Ph-T-PhMe), in some embodiments, causes the maximum value of tan δ (e.g., at 140° C.) for solid compositions comprising the two components to increase, in some instances significantly. Thus, in some embodiments, the maximum tan δ value is increased by at least 5%, e.g., at least 10%, at least 12% or at least 15% relative to resin-linear organosiloxane block copolymer compositions that have not been blended with cyclic organopolysiloxanes.

The incorporation of cyclic organopolysiloxanes into resin-linear organosiloxane block copolymer compositions (i.e., component A; e.g., 45 wt % Ph-T-PhMe), in some embodiments, causes the value of minimum storage modulus, G', for solid compositions comprising the two components to decrease, in some instances significantly. Thus, in some embodiments, the minimum G' (e.g., at 140° C.) value is decreased by at least 30%, e.g., at least 40%, at least 50% or at least 60% (e.g., from about 30% to about 70%, from about 50% to about 70% or from about 40% to about 67%) relative to resin-linear organosiloxane block copolymer compositions that have not been blended with cyclic organopolysiloxanes.

In some embodiments, the incorporation of cyclic organopolysiloxanes into resin-linear organosiloxane block copolymer compositions (i.e., component A; e.g., 45 wt % Ph-T-PhMe), in some embodiments, causes the maximum tan δ (e.g., at 140° C.) value to increase by at least 5%, e.g., at least 10%, at least 12% or at least 15% relative to resin-linear organosiloxane block copolymer compositions that have not been blended with cyclic organopolysiloxanes; and, at the same time, the minimum G' (e.g., at 140° C.) value to decrease by at least 30%, e.g., at least 40%, at least 50% or at least 60% (e.g., from about 30% to about 70%, from about 50% to about 70% or from about 40% to about 67%) relative to resin-linear organosiloxane block copolymer compositions that have not been blended with cyclic organopolysiloxanes.

While component B) may be selected from a variety of organopolysiloxanes, in some embodiments, it is chosen to be compatible with either the "linear" or "resin" portion of resin-linear organosiloxane block copolymer used in component A). In one embodiment, the organosiloxane selected as component B) may be considered a "linear" organopolysiloxane, where the majority of siloxy units in the organopolysiloxane are $R^2_2SiO_{2/2}$ units. In another embodiment, the organosiloxane selected as component B) may be considered as a "resin" organopolysiloxane, where the majority of siloxy units in the organopolysiloxane are $R^2SiO_{3/2}$ and/or $SiO_{4/2}$ units.

The "linear" organopolysiloxane may be a polydiorganosiloxane. Such polydiorganosiloxanes, in some embodiments, contain a majority of $R^2_2SiO_{2/2}$ siloxy units in their formula (for example, where d would be greater than 0.5 in the above average formula). In some embodiments, the polydiorganosiloxane contains a majority of [(aryl)(alkyl)SiO$_{2/2}$] siloxy units (e.g., [(C$_6$H$_5$)(CH$_3$)SiO$_{2/2}$] siloxy units, such as polymethylphenylsiloxanes). Suitable polydiorganosiloxanes includes those having the average formula:

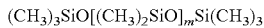

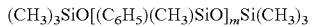

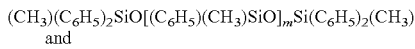
and

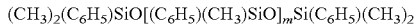

where m is ≥1, alternatively m is an integer from 1 to 200,
   alternatively 1 to 100,
      alternatively from 1 to 50,
         alternatively from 1 to 10.

Other suitable polydiorganosiloxanes includes those having the average formula:

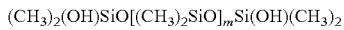

and

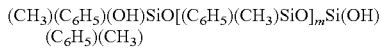

where m is ≥1, alternatively m is an integer from 1 to 200,
   alternatively 1 to 100,
      alternatively from 1 to 50,
         alternatively from 1 to 10.

Representative commercially available "linear" organopolysiloxanes suitable as component B) include, but are not limited to Dow Corning®704 Fluid, Dow Corning® 705 Fluid, Dow Corning® 710 Fluid, Dow Corning® 510 Fluid, Dow Corning® 550 Fluid, Dow Corning® 2716 Fluid, and Dow Corning® 2666 Fluid.

The "resin" organopolysiloxane may be selected from those organosiloxane resins comprising at least 60 mole % of [R$^2$SiO$_{3/2}$] siloxy units in its formula, where each R$^2$, at each occurrence, is as defined herein. The "resin" organopolysiloxane may contain any amount and combination of other M, D, T, and Q siloxy units, provided the "resin" organopolysiloxane contains at least 60 mole % of [R$^2$SiO$_{3/2}$] (T units) siloxy units, alternatively the "resin" organopolysiloxane contains at least 70 mole % of [R$^2$SiO$_{3/2}$] siloxy units, at least 80 mole % of [R$^2$SiO$_{3/2}$] siloxy units, alternatively the "resin" organopolysiloxane contains at least 90 mole % of [R$^2$SiO$_{3/2}$] siloxy units, or alternatively the "resin" organopolysiloxane contains at least 95 mole % of [R$^2$SiO$_{3/2}$] siloxy units. In some embodiments, the "resin" organopolysiloxane contains from about 60 to about 100 mole % of [R$^2$SiO$_{3/2}$] siloxy units, e.g., from about 60 to about 95 mole % of [R$^2$SiO$_{3/2}$] siloxy units, from about 60 to about 85 mole % of [R$^2$SiO$_{3/2}$] siloxy units, from about 80 to about 95 mole % of [R$^2$SiO$_{3/2}$] units or from about 90 to about 95 mole % of [R$^2$SiO$_{3/2}$]. "Resin" organopolysiloxane useful as component B) include those known as "silsesquioxane" resins and "MQ" resins such as M$^H$Q or M$^{Vi}$Q, where "Vi" refers broadly to a moiety comprising a vinyl group. See, e.g., MQ resins disclosed in U.S. Pat. No. 2,857,356, which is incorporated by reference as if fully set forth herein.

Organosiloxane resins containing at least 60 mole % of [R$^2$SiO$_{3/2}$] and methods for preparing them are known in the art. In some embodiments, they are prepared by hydrolyzing an organosilane having three hydrolyzable groups on the silicon atom, such as a halogen or alkoxy group in an organic solvent. A representative example for the preparation of a silsesquioxane resin may be found in U.S. Pat. No. 5,075,103. Furthermore, many organosiloxane resins are available commercially and sold either as a solid (flake or powder), or dissolved in an organic solvent. Suitable, non-limiting, commercially available organosiloxane resins useful as component b) include; Dow Corning® 217 Flake Resin, 233 Flake, 220 Flake, 249 Flake, 255 Flake, Z-6018 Flake (Dow Corning Corporation, Midland Mich.).

One skilled in the art recognizes that organosiloxane resins containing such high amounts of [R$^2$SiO$_{3/2}$] siloxy units may have a certain concentration of Si—OZ where Z may be hydrogen (i.e., silanol) or an alkyl group (so that OZ is an alkoxy group). The Si—OZ content as a mole percentage of all siloxy groups present on the organosiloxane resin may be readily determined by $^{29}$Si NMR. The concentration of the OZ groups present on the organosiloxane resin will vary, as dependent on the mode of preparation, and subsequent treatment of the resin. In some embodiments, the silanol (Si—OH) content of organosiloxane resins suitable for use in the present process will have a silanol content of at least 5 mole %, alternatively of at least 10 mole %, alternatively 25 mole %, alternatively 40 mole %, or alternatively 50 mole %. In other embodiments, the silanol content is from about 5 mole % to about 60 mole %, e.g., from about 10 mole % to about 60 mole %, from about 25 mole % to about 60 mole %, from about 40 mole % to about 60 mole %, from about 25 mole % to about 40 mole % or from about 25 mole % to about 50 mole %.

One skilled in the art further recognizes that organosiloxane resins containing such high amounts of [R$^2$SiO$_{3/2}$] siloxy units and silanol contents may also retain water molecules, especially in high humidity conditions. Thus, it is often beneficial to remove excess water present on the resin by "drying" the organosiloxane resin. This may be achieved by dissolving the organosiloxane resin in an organic solvent, heating to reflux, and removing water by separation techniques (for example, Dean Stark trap or equivalent process).

The amounts of component A) and B) combined may vary so as to provide a weight ratio of component A) to component B) that ranges from about 99.5/0.5 to about 10/90, alternatively from about 90/10 to about 10/90, from about 80/20 to about 20/80, from about 70/30 to about 30/70, or alternatively from about 60/40 to about 40/60 or even 50/50. In some embodiments, the amounts of component A) and B) combined may vary so as to provide a weight ratio of component A) to component B) that is about 95/5, about 99/1 or about 99.5/0.5.

The method for combining components A) and B) is not limiting and, in some embodiments, does not require any special or unique processing. In some embodiments, components A) and B) are combined and may be mixed using simple mixing processes such as stirring.

Solid compositions containing the resin-linear organosiloxane block copolymers and organopolysiloxanes may be prepared by removing the solvent from the compositions as described herein. The solvent may be removed by any known processing techniques. In one embodiment, a film of the compositions containing the organosiloxane block copolymers and organopolysiloxanes is formed, and the solvent is allowed to evaporate from the film. Subjecting the films to elevated temperatures, and/or reduced pressures, will accelerate solvent removal and subsequent formation of the solid curable composition. Alternatively, the present compositions may be passed through an extruder to remove solvent and provide the solid composition in the form of a ribbon or pellets. Coating operations against a release film could also be used as in slot die coating, knife over roll, rod, or gravure coating. Also, roll-to-roll coating operations could be used to prepare a solid film. In coating operations, a conveyer oven or other means of heating and evacuating the solution can be used to drive off the solvent and obtain the final solid film.

In some embodiments, the solid compositions, which include a resin-linear organosiloxane block copolymer, may also contain a stabilizer. See, e.g., PCT Appl. No. PCT/US2012/067334, filed Nov. 30, 2012; and U.S. Provisional Appl. No. 61/566,031, filed Dec. 2, 2011, the entireties of which are incorporated by reference as if fully set forth herein. A stabilizer may be added to component A) and/or to component B) before the two components. Alternatively, a stabilizer may be added to components A) and B) after the two components are combined.

In some embodiments, the solid compositions, which include a resin-linear organosiloxane block copolymer, may contain a superbase catalyst. See, e.g., PCT Appl. No. PCT/US2012/069701, filed Dec. 14, 2012; and U.S. Provisional Appl. No. 61/570,477, filed Dec. 14, 2012, the entireties of which are incorporated by reference as if fully set forth herein. A superbase may be added to component A) and/or to component B) before the two components are combined. Alternatively, a superbase may be added to components A) and B) after the two components are combined.

Although not wishing to be bound by any theory, it is possible that the structural ordering of the disiloxy and trisiloxy units in the organosiloxane block copolymer, as described herein, may provide the copolymer with certain unique physical property characteristics when solid compositions of the block copolymer are formed. For example, the structural ordering of the disiloxy and trisiloxy units in the copolymer may provide solid coatings that allow for a high optical transmittance of visible light (e.g., at wavelengths above 350 nm). The structural ordering may also allow the organosiloxane block copolymer to flow and cure upon heating, yet remain stable at room temperature. They may also be processed using lamination techniques. These properties are useful to provide coatings for various electronic articles to improve weather resistance and durability, while providing low cost and easy procedures that are energy efficient.

In some embodiments, the physical properties of the organosiloxane block copolymers used in component A) may be further enhanced by the addition of the organopolysiloxanes as described herein as component B). In some embodiments, the addition of component B) to component A) may enhance the flexibility of compositions (e.g., increase the flexibility of a composition by at least 10%, at least 20%, at least 30%, at least 40%, at least 50%, at least 75% or at least 100%, as measured using Mandrel Test (ASTM D1737) of compositions, including solid curable or solid cured compositions); enhance the elongation at break of solid films/coatings derived from compositions comprising the two components; enhance processability (e.g., plasticization to improve flowability); affect the glass transition temperature of component A) and/or B) in a favorable fashion; and, in some cases, affect the cure speed (e.g., increase the cure rate).

One advantage of the resin-linear organopolysiloxanes block copolymers used in component A) is that they can be processed several times, because the processing temperature ($T_{processing}$) is less than the temperature required to finally cure ($T_{cure}$) the organosiloxane block copolymer, i.e., $T_{processing} < T_{cure}$. However the organosiloxane copolymer will cure and achieve high temperature stability when $T_{processing}$ is taken above $T_{cure}$. Thus, the present resin-linear organopolysiloxanes block copolymers offer the significant advantage of being "re-processable" in conjunction with the benefits that may be associated with silicones, such as; hydrophobicity, high temperature stability, and moisture/UV resistance.

In one embodiment, solid compositions of the organosiloxane block copolymers and/or solid compositions comprising components A) and B), may be considered as "melt processable." In some embodiments, the solid compositions, such as a coating formed from a film of a solution containing components A) and B), exhibit fluid behavior at elevated temperatures, that is upon "melting." The "melt processable" features of the solid compositions comprising components A) and B) may be monitored by measuring the "melt flow temperature" of the solid compositions, that is when the solid composition demonstrates liquid behavior. The melt flow temperature may specifically be determined by measuring the storage modulus (G'), loss modulus (G") and tan delta (tan δ) as a function of temperature storage using commercially available instruments. For example, a commercial rheometer (such as TA Instruments' ARES-RDA with 2KSTD standard flexular pivot spring transducer, with forced convection oven) may be used to measure the storage modulus (G'), loss modulus (G") and tan delta as a function of temperature. Test specimens (e.g., 8 mm wide, 1 mm thick) may be loaded in between parallel plates and measured using small strain oscillatory rheology while ramping the temperature in a range from 25° C. to 300° C. at 2° C./min. (frequency 1 Hz). The flow onset may be calculated as the inflection temperature in the G' drop (labeled FLOW), the viscosity at 120° C. is reported as a measure for melt processability and the cure onset is calculated as the onset temperature in the G' rise (labeled CURE). In some embodiments, the FLOW of the solid compositions will also correlate to the glass transition temperature of the non-linear segments (i.e., the resin component) in the organosiloxane block copolymer.

In some embodiments, the solid compositions may be characterized as having a melt flow temperature ranging from 25° C. to 200° C., alternatively from 25° C. to 160° C., or alternatively from 50° C. to 160° C.

It is believed that the melt processability benefits enables the reflow of solid compositions comprising components A) and B) around device architectures at temperatures below $T_{cure}$, after an initial coating or solid is formed on the device. This feature is very beneficial to encapsulated various electronic devices, such as LEDs.

In some embodiments, the addition of organopolysiloxanes (B) to organosiloxane block copolymers (A) provides solid compositions having reduced viscosities at the melt flow temperature, versus similar compositions of the organosiloxane block copolymers (A) alone, while the solid compositions retain their optical transmission (e.g., the optical transmission is not adversely affected).

The solid compositions may be further characterized by certain physical properties such as tensile strength and % elongation at break. In some embodiments, solid compositions comprising components A) and B) may have an initial tensile strength greater than 1.0 MPa, alternatively greater than 1.5 MPa, or alternatively greater than 2 MPa. In some embodiments, the solid compositions may have an initial tensile strength for from 1.0 MPa to about 10 MPa, e.g., from about 1.0 to about 2 MPa; from about 1.0 to about 1.8 MPa; from about 1.3 to about 1.8 MPa; from about 1.5 to about 1.8 MPa; from about 1.5 MPa to about 10 MPa, from about 2 MPa to about 10 MPa, from about 5 MPa to about 10 MPa or from about 7 MPa to about 10 MPa. In some embodiments, solid compositions comprising components A) and B) may have an initial % elongation at break (or rupture) greater than 40%, alternatively greater than 50%, alternatively greater than 75%, alternatively greater than 100% or greater than 150%. In some embodiments, the solid compositions may have a % elongation at break (or rupture) of from about 20% to about 175%, e.g., from about 20% to about 90%, 25% to about 50%, from about 20% to about 60%, from about 40% to about 60%, from about 40% to about 50%, from about 75% to about 90%, about 75% to about 175%, from about 125% to about 175% or from about 140% to about 160%. As used herein, tensile strength and % elongation at break are measured according to ASTM D412. In other embodiments, the solid compositions may have a % elongation at break (or rupture) of from about 100% to about 1000%, e.g., from about 250% to about 600%, from about 300% to about 900% or from about 100% to about 300%.

Some of the embodiments of the present invention relate to optical assemblies and articles comprising the compositions described herein such as those described in PCT/US2012/071011, filed Dec. 20, 2012; PCT/US2013/021707, filed Jan. 16, 2013; and PCT/US2013/025126, filed Feb. 7, 2013, all of which are incorporated by reference as if fully set forth herein. Accordingly, some embodiments of the present invention relate to an LED encapsulant comprising an organosiloxane block copolymer of any preceding claim.

The term "about," as used herein, can allow for a degree of variability in a value or range, for example, within 10%, within 5%, or within 1% of a stated value or of a stated limit of a range.

Values expressed in a range format should be interpreted in a flexible manner to include not only the numerical values explicitly recited as the limits of the range, but also to include all the individual numerical values or sub-ranges encompassed within that range as if each numerical value and sub-range were explicitly recited. For example, a range of "about 0.1% to about 5%" or "about 0.1% to 5%" should be interpreted to include not just about 0.1% to about 5%, but also the individual values (e.g., 1%, 2%, 3%, and 4%) and the sub-ranges (e.g., 0.1% to 0.5%, 1.1% to 2.2%, 3.3% to 4.4%) within the indicated range.

It has been found that the addition of the aforementioned organopolysiloxanes to resin-linear organosiloxane block copolymer compositions may improve the flexibility of solid coatings resulting from these compositions. In particular, the present compositions may have improved elongation at break.

Embodiments of the invention described and claimed herein are not to be limited in scope by the specific embodiments herein disclosed, since these embodiments are intended as illustration of several aspects of the disclosure. Any equivalent embodiments are intended to be within the scope of this disclosure. Indeed, various modifications of the embodiments in addition to those shown and described herein will become apparent to those skilled in the art from the foregoing description. Such modifications are also intended to fall within the scope of the appended claims.

The Abstract is provided to allow the reader to quickly ascertain the nature of the technical disclosure. It is submitted with the understanding that it will not be used to interpret or limit the scope or meaning of the claims.

EXAMPLES

The following examples are included to demonstrate specific embodiments of the invention. However, those of skill in the art should, in light of the present disclosure, appreciate that many changes can be made in the specific embodiments which are disclosed and still obtain a like or similar result without departing from the spirit and scope of the invention.

All percentages are in wt %. All measurements were conducted at 23° C. unless indicated otherwise.

Materials

The following components were used to prepare blended compositions:

RL1 (where "RL" refers to "resin linear"): a 45% Ph-T-117 dp PhMe resin-linear block copolymer having the formula $D^{PhMe}_{0.536}T^{Alkyl}_{0.054}T^{Ph}_{0.402}$, 70.8% solids in toluene, as prepared in a similar manner to Example 12 of Published PCT Appl. No. WO2012/040302, which is incorporated by reference as if fully set forth herein.

RL2: a 45% Ph-T-98 dp PhMe resin linear block copolymer having the formula $D^{PhMe}_{0.535}T^{Alkyl}_{0.011}T^{Ph}_{0.449}$ and was 71.8% solids in xylenes. It was prepared in a similar manner to Example 12 of Published PCT Appl. No. WO2012/040302, which is incorporated by reference as if fully set forth herein, except that xylenes was used instead of toluene and that a phenyl-T resin made by a similar process to RL3 shown below was used in instead of Dow Corning 217 flake resin.

RL3: a 45% Ph-T—100 dp PhMe resin-linear block copolymer having the formula $D^{PhMe}_{0.529}T^{Alkyl}_{0.055}T^{Ph}_{0.416}$, 58.2% solids in toluene, as prepared in a similar manner to Example 12 of Published PCT Appl. No. WO2012/040302, which is incorporated by reference as if fully set forth herein.

RL4: a 55% Ph-T—140 dp PhMe resin-linear block copolymer having the formula $D^{PhMe}_{0.423}T^{Alkyl}_{0.060}T^{Ph}_{0.511}$, 71.5% solids in toluene, as prepared in a similar manner to Example 15 of Published PCT Appl. No. WO2012/040302, which is incorporated by reference as if fully set forth herein.

RL5: a 35% Ph-T—130 dp PhMe resin-linear block copolymer having the formula $D^{PhMe}_{0.625}T^{Alkyl}_{0.043}T^{Ph}_{0.326}$, 69.1% solids in toluene, as prepared in a similar manner to Example 14 of Published PCT Appl. No. WO2012/040302, which is incorporated by reference as if fully set forth herein, except that it was run at 60% solids in toluene instead of 50%.

RL6: a 45% Ph-T—130 dp PhMe resin-linear block copolymer having the formula $D^{PhMe}_{0.517}T^{Alkyl}_{0.050}T^{Ph}_{0.423}$, 68.8% solids in toluene, as prepared in a similar manner to Example 12 of Published PCT Appl. No. WO2012/040302, which is incorporated by reference as if fully set forth herein, except that it was run at 60% solids in toluene instead of 50%.

RE1 (where "RE" refers to "resin"): Dow Corning® 217 Flake Resin.

RE2: a 5,000 g/mole (59.5% in toluene) Ph-T hydrolyzate resin prepared as follows.

A 2 L 3-neck round bottom flask was loaded with deionized water (DI) (457.7 g). The flask was equipped with a teflon stir paddle, thermometer, and a water-cooled condenser. Water was cooled down to 5° C. using an ice-water bath. A premixed solution of phenyltrichlorosilane (233.38 g, 1.103 moles) and toluene (223.5 g) was added quickly starting at 5° C. After addition was complete it was mixed for 5 minutes with the ice bath removed. Mixing was stopped and then the aqueous layer was removed. Some DI water (37.3 g) was added and then it was heated at 80° C. for 15 minutes after which the aqueous phase was removed. The following process was repeated several times to remove residual HCl: added 2-propanol (9.3 g) and DI water (28.0 g), heated at 80° C. for 15 minutes, removed aqueous phase. Reaction mixture was heated to reflux to remove residual water via azeotropic distillation and then some toluene was removed by distillation. Product solution was pressure filtered through a 0.45 μm filter. Product had an $M_W$ of 4870 g/mole.

RE3: a 5,000 g/mole (58.2% in xylenes) Ph-T hydrolyzate resin prepared as follows.

A 2 L 3-neck round bottom flask was loaded with DI water (457.7 g). The flask was equipped with a teflon stir paddle, thermometer, and a water-cooled condenser. Water was cooled down to 5° C. using an ice-water bath. A pre-mixed solution of phenyltrichlorosilane (233.38 g, 1.103 moles) and xylenes (223.5 g) was added quickly starting at 5° C. After addition was complete it was mixed for 5 minutes with the ice bath removed. Mixing was stopped and then the aqueous layer was removed. The following process was repeated several times to remove residual HCl: added 2-propanol (9.3 g) and DI water (28.0 g), heated at 80° C. for 15 minutes, removed aqueous phase. Reaction mixture was heated to reflux to remove residual water via azeotropic distillation and then some xylenes were removed by distillation. Product had an $M_W$ of 5180 g/mole.

L1 (where "L" refers to "linear"): Dow Corning® 705 fluid: 96 wt % trimethylpentaphenyltrisiloxane, 3 wt % tetramethylhexaphenyltetrasiloxane, 1 wt % tetraphenyldimethyldisiloxane.

L2: Dow Corning® 710 fluid: a linear phenylmethylsiloxane end blocked trimethylsilyl groups.

Blended compositions were made by introducing components in vials, mixing on a rotary wheel and 5 mil draw down coating samples in thin films against a siliconized release liner, with final resulting thickness around 80-100 micron.

effectively containing 55 wt % Ph-T, with 10 wt. % of the Ph-T resin being free, extractable resin) to have improved flexibility over a resin-linear organosiloxane block copolymer containing 55 wt % Ph-T coupled to a PhMe linear.

Another surprising and unexpected result arises from the fact that blending can be used, in some embodiments, to reduce the storage modulus (G') value of solid resin-linear organosiloxane block copolymer compositions at a temperature that is above the $T_g$ of the resin and below the cure temperature of the resin-linear organosiloxane block copolymer composition (e.g., a G' value measured at temperatures from about 40° C. to about 250° C., from about 100 to about 175° C. or from about 100 to about 150° C.). Thus, for example, solid resin-linear organosiloxane block copolymer compositions having G' values outside the range of from about 0.5 to about 50 kPa (e.g., from about 0.5 to about 25 kPa, from about 1 to about 10 kPa or from about 1 to about 5 kPa at 150° C.; and having a tan delta from about 5 to about 0.5, from about 3 to about 0.5, from about 2 to about 0.5 or from about 2 to about 1 at 150° C.) may be blended with resin and/or linear organopolysiloxanes, as described herein, to bring the G' (and tan delta values) within the G' range of from about 0.5 to about 50 kPa. In other words, the G' is reduced to a value ranging from about 0.5 to about 50 kPa.

Further, blending of resin and/or linear organopolysiloxanes with resin-linear organosiloxane block copolymers (e.g., blended to contain substantially the same percentages of

| Example | RL used as Component A) | RE used as Component B) | L used as Component B) | total wt % RE | 1 hour 60° C. vacuum, film optical | flexibility | viscosity at 120° C., Pa · s |
|---|---|---|---|---|---|---|---|
| A | RL1 | none | none | 45 | Clear | high | 800 |
| B | RL2 | none | none | 45 | Clear | high | 400 |
| C | RL3 | none | none | 45 | Clear | high | 23 |
| D | RL1 | RE1 | none | 51.6 | Clear | high | 800 |
| E | RL1 | RE1 | none | 55.5 | Clear | high | 790 |
| F | RL1 | RE1 | none | 60.3 | Clear | high | 830 |
| G | RL1 | RE2 | none | 60.3 | Clear | high | 3,200 |
| H | RL2 | RE3 | none | 60.3 | Clear | high | 9,500 |
| I | RL1 | none | L1 | 40.5 | Clear | high | not measured |
| J | RL3 | none | L2 | 40.5 | Clear | high | 10 |
| Comparative Example 1 | RL4 | none | none | 55 | Clear | low | 6,930 | total wt % R refers to the amount of R in RL + R + L

As shown in the table above, blending resin or linear organopolysiloxanes with resin-linear organosiloxane block copolymers can be used to tune the viscosity of the resin-linear melt at 120° C. without negatively impacting the optical clarity of the film. Moreover, a surprising and unexpected result was found when comparing the comparative example containing only RL4 (resin-linear with 55 wt % Ph-T coupled to a PhMe linear) with Example E. Example E uses a blend of RL1 (45 wt % Ph-T-PhMe copolymer) and RE1 (10 wt % of Ph-T resin), such that Example E contains the same total (i.e., 55 wt % Ph-T) resin content. Low flexibility was found for RL4, used alone, whereas the blended sample of Example E retains excellent flexibility, as measured using Mandrel Test (ASTM D1737). This would be counter to expectation, primarily because blending would not be expected to improve flexibility, relative to compositions containing the resin-linear organosiloxane block copolymer compositions where the resin-linear organosiloxane block copolymer contains the same weight percent of resin and linear components as blended compositions. For example, those of skill in the art would not have expected a 45 wt % Ph-T-PhMe copolymer blended with 10 wt % of Ph-T resin (i.e., a composition resin and linear organopolysiloxane content as the resin-linear organosiloxane block copolymer composition) may provide solid compositions with reduced G' values (e.g., at 150° C.), but having percent elongation at break within about 50% (e.g., within about 30%, within about 25%, within about 15%, within about 10% or within about 5%) of the percent elongation at break of unblended resin-linear organosiloxane block copolymer compositions; tensile strength at break within about 25% (e.g., within about 15%, within about 10% or within about 5%) of the tensile strength at break of unblended resin-linear organosiloxane block copolymer compositions; and/or tensile modulus within about 20% (e.g., within about 15%, within about 10% or within about 5%) of unblended resin-linear organosiloxane block copolymer compositions. All such compositions would also be expected to retain optical clarity (e.g., the same optical clarity as unblended resin-linear organosiloxane block copolymer organopolysiloxane compositions).

For example, RL1 has been observed to have a tensile strength of 1.5 MPa, a % elongation at break of 44%, and a tensile modulus (e.g., as determined using ASTM D412) of 92 MPa. When blended with about 10 wt. % L2, an RL1/L2 blend has been observed to have a tensile strength of 1.6 MPa, a % elongation at break of 150%, and a tensile modulus of 49 MPa. This blend produces a solid composition having a significantly greater % elongation at break, compared to a solid composition containing only RL1 composition. Such an increase in % elongation at break also means that a solid composition containing a blend of RL1 and L2 also has high flexibility. When blended with about 10 wt. % RE1, an RL1/RE1 blend has been observed to have a tensile strength of 1.8 MPa, a % elongation at break of 43%, and a tensile modulus of about 130 MPa. Finally, when blended with about 10 wt. % of a mixture of RE1 and L2 (45/55 by weight), the RL1 blend has been observed to have a tensile strength of 1.3 MPa, a % elongation at break of 63%, and a tensile modulus of 86 MPa. In this last example, where RL1 is blended with a mixture of RE1 and L2, the tensile strength at break is within about 13% of the tensile strength at break for RL1; the percent elongation at break is within about 30% of the percent elongation at break for RL1; and the tensile modulus is within about 6.5% of the tensile modulus for RL1.

In some embodiments, blending resin-linear organosiloxane block copolymer with cyclic diorganopolysiloxanes may have a significant and unexpected impact on lowering G' (and increasing tan delta) relative to blending with resin and/or linear organopolysiloxanes. For example, one may only need to add about an order of magnitude less cyclic diorganopolysiloxane to obtain the same drop in G', relative to when a resin-linear organosiloxane block copolymer is blended with a resin and/or linear organopolysiloxane. Thus, for example, if about 10 wt. % of resin and/or linear diorganopolysiloxane is needed to cause the G' value at 150° C. to drop by a certain percentage, one might only need about 1 wt. % of cyclic diorganopolysiloxane to effect the same drop in G'.

Additional examples are shown in the below table:

| Example | RL used as Component A) | R used as Component B) | catalyst | Total wt % R | Tensile strength at break, MPa | Elongation at break, % |
|---|---|---|---|---|---|---|
| K | RL6 | R1 | 50 ppm DBU | 51 | 7.7 | 21 |
| L | RL6 | R1 | 50 ppm DBU | 56 | 7.9 | 7 |
| M | RL6 | R1 | 50 ppm DBU | 62 | too brittle to test | too brittle to test |
| N | RL5 | R1 | No | 45 | 3.0 | 112 |
| comparative 1 | RL4 | none | 50 ppm DBU | 55 | too brittle to test | too brittle to test |
| comparative 2 | RL6 | none | No | 45 | 1.5 | 64 | all tested samples were cast at about 1.5 mm thickness and cured using the following cure schedule in a forced air oven: 4 hours at 70° C., 4 hours at 120° C., 3 hours at 160° C.

As can be seen in the Table, blending Ph-T resin into the resin-linear can be used to extend the amount of Ph-T resin in the total composition without jeopardizing brittle behavior. For example, example L shows that blending R1 into RL6 results in a total R content of 56 wt %, beyond the 55 wt % of the comparative Example 1 (RL4). Comparative 1, however, is too brittle to test while Example L still shows some toughness. Example N can also be compared to comparative Example 2: Example N reaches the same total wt % resin but achieves better elongation at break and tensile strength at break therefore improves overall toughness of the composition.

The invention claimed is:

1. A composition comprising:
A) one or more resin-linear organosiloxane block copolymer compositions comprising:
40 to 90 mole percent disiloxy units of the formula $[R^1_2SiO_{2/2}]$,
10 to 60 mole percent trisiloxy units of the formula $[R^2SiO_{3/2}]$,
0.5 to 35 mole percent silanol groups [≡SiOH];
wherein:
each $R^1$, at each occurrence, is independently a $C_1$ to $C_{30}$ hydrocarbyl,
$R^2$, at each occurrence, is independently a $C_1$ to $C_{20}$ hydrocarbyl;
wherein:
the disiloxy units $[R^1_2SiO_{2/2}]$ are arranged in linear blocks having an average of from 10 to 400 disiloxy units $[R^1_2SiO_{2/2}]$ per linear block,
the trisiloxy units $[R^2SiO_{3/2}]$ are arranged in non-linear blocks having a molecular weight of at least 500 g/mole, and at least 30% of the non-linear blocks are crosslinked with each other, each linear block is linked to at least one non-linear block, and
the organosiloxane block copolymer has a weight average molecular weight ($M_w$) of at least 20,000 g/mole; and
B) at least one of a phenyl silsesquioxane resin and a polydiorganosiloxane;
wherein the weight ratio of component A) to component B) may vary from 99.5/0.5 to 10/90.

2. The composition of claim 1, wherein the weight ratio of component A) to component B) is about 99.5/0.5.

3. The composition of claim 1, wherein the phenyl silsesquioxane resin comprises at least 60 mole percent of $(C_6H_5)SiO_{3/2}$ siloxy units.

4. The composition of claim 1, wherein the phenyl silsesquioxane resin consists essentially of $(C_6H_5)SiO_{3/2}$ siloxy units.

5. The composition of claim 1, wherein the polydiorganosiloxane is polymethylphenylsiloxane.

6. The composition of claim 1, wherein the polydiorganosiloxane has the formula $(CH_3)_3SiO[(CH_3)_2SiO]_mSi(CH_3)_3$ wherein m is ≥1.

7. The composition of claim 6, wherein m is an integer from 1 to 200.

8. The composition of claim 1, wherein the polydiorganosiloxane has the formula $(CH_3)_3SiO[(C_6H_5)(CH_3)SiO]_mSi(CH_3)_3$ wherein m is ≥1.

9. The composition of claim 1, wherein the polydiorganosiloxane has the formula $(CH_3)(C_6H_5)_2SiO[(C_6H_5)(CH_3)SiO]_mSi(C_6H_5)_2(CH_3)$ wherein m is ≥1.

10. The composition of claim 1, wherein the polydiorganosiloxane has the formula $(CH_3)(C_6H_5)(OH)SiO[(C_6H_5)(CH_3)SiO]_mSi(OH)(C_6H_5)(CH_3)$ wherein m is ≥1.

11. The composition of claim 1, wherein the polydiorganosiloxane has the formula $(CH_3)_2(OH)SiO[(C_6H_5)(CH_3)SiO]_mSi(OH)(CH_3)_2$ wherein m is ≥1.

12. The composition of claim 1, wherein A) and/or B) further comprises a solvent.

13. The composition of claim 1, wherein B) the organopolysiloxane is a cyclic polydiorganosiloxane.

14. The composition of claim 13, wherein the cyclic polydiorganosiloxane has the formula:

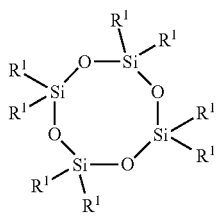

wherein each $R^1$, at each occurrence, is independently a $C_1$ to $C_{30}$ hydrocarbyl.

15. The composition of claim 14, wherein each $R^1$, at each occurrence, is independently methyl or phenyl.

16. A solid film composition comprising a curable composition of claim 15.

17. The cured product of composition of claim 16.

18. The solid film compositions of claim 16, wherein the solid composition has an optical transmittance of at least 95%.

19. The composition of claim 1, wherein the composition is curable.

20. An LED encapsulant comprising the compositions of claim 1.

21. A method for increasing the flexibility of a solid resin-linear organosiloxane block copolymer composition comprising combining one or more resin-linear organosiloxane block copolymer compositions and at least one of a phenyl silsesquioxane resin and a polydiorganosiloxane,
wherein the weight ratio of the organosiloxane block copolymer composition to the organopolysiloxane may vary from 90/10 to 10/90; and
wherein the one or more resin-linear organosiloxane block copolymer compositions comprise:
40 to 90 mole percent disiloxy units of the formula $[R^1_2SiO_{2/2}]$,
10 to 60 mole percent trisiloxy units of the formula $[R^2SiO_{3/2}]$,
0.5 to 35 mole percent silanol groups $[\equiv SiOH]$;
wherein:
each $R^1$, at each occurrence, is independently a $C_1$ to $C_{30}$ hydrocarbyl,
$R^2$, at each occurrence, is independently a $C_1$ to $C_{20}$ hydrocarbyl;
wherein:
the disiloxy units $[R^1_2SiO_{2/2}]$ are arranged in linear blocks having an average of from 10 to 400 disiloxy units $[R^1_2SiO_{2/2}]$ per linear block,
the trisiloxy units $[R^2SiO_{3/2}]$ are arranged in non-linear blocks having a molecular weight of at least 500 g/mole, and at least 30% of the non-linear blocks are crosslinked with each other, each linear block is linked to at least one non-linear block, and
the organosiloxane block copolymer has a weight average molecular weight $(M_w)$ of at least 20,000 g/mole.

22. A method for reducing the viscosity of a solid resin-linear organosiloxane block copolymer composition comprising combining one or more resin-linear organosiloxane block copolymer compositions and at least one of a phenyl silsesquioxane resin and a polydiorganosiloxane,
wherein the weight ratio of the organosiloxane block copolymer composition to the organopolysiloxane may vary from 90/10 to 10/90; and
wherein the one or more resin-linear organosiloxane block copolymer compositions comprise:
40 to 90 mole percent disiloxy units of the formula $[R^1_2SiO_{2/2}]$,
10 to 60 mole percent trisiloxy units of the formula $[R^2SiO_{3/2}]$,
0.5 to 35 mole percent silanol groups $[\equiv SiOH]$;
wherein:
each $R^1$, at each occurrence, is independently a $C_1$ to $C_{30}$ hydrocarbyl,
$R^2$, at each occurrence, is independently a $C_1$ to $C_{20}$ hydrocarbyl;
wherein:
the disiloxy units $[R^1_2SiO_{2/2}]$ are arranged in linear blocks having an average of from 10 to 400 disiloxy units $[R^1_2SiO_{2/2}]$ per linear block,
the trisiloxy units $[R^2SiO_{3/2}]$ are arranged in non-linear blocks having a molecular weight of at least 500 g/mole, and at least 30% of the non-linear blocks are crosslinked with each other, each linear block is linked to at least one non-linear block, and
the organosiloxane block copolymer has a weight average molecular weight $(M_w)$ of at least 20,000 g/mole.

23. A method for reducing the storage modulus of a solid resin-linear organosiloxane block copolymer composition comprising combining one or more resin-linear organosiloxane block copolymer compositions and at least one of a phenyl silsesquioxane resin and a polydiorganosiloxane,
wherein the weight ratio of the organosiloxane block copolymer composition to the organopolysiloxane may vary from 90/10 to 10/90; and
wherein the one or more resin-linear organosiloxane block copolymer compositions comprise:
40 to 90 mole percent disiloxy units of the formula $[R^1_2SiO_{2/2}]$,
10 to 60 mole percent trisiloxy units of the formula $[R^2SiO_{3/2}]$,
0.5 to 35 mole percent silanol groups $[\equiv SiOH]$;
wherein:
each $R^1$, at each occurrence, is independently a $C_1$ to $C_{30}$ hydrocarbyl,
$R^2$, at each occurrence, is independently a $C_1$ to $C_{20}$ hydrocarbyl;
wherein:
the disiloxy units $[R^1_2SiO_{2/2}]$ are arranged in linear blocks having an average of from 10 to 400 disiloxy units $[R^1_2SiO_{2/2}]$ per linear block,
the trisiloxy units $[R^2SiO_{3/2}]$ are arranged in non-linear blocks having a molecular weight of at least 500 g/mole, and at least 30% of the non-linear blocks are crosslinked with each other, each linear block is linked to at least one non-linear block, and
the organosiloxane block copolymer has a weight average molecular weight $(M_w)$ of at least 20,000 g/mole.

24. The method of claim 23, wherein the storage modulus is reduced to a value ranging from about 0.5 to about 50 kPa.

* * * * *